United States Patent
Rondon et al.

(10) Patent No.: US 11,753,736 B2
(45) Date of Patent: Sep. 12, 2023

(54) INDIUM ELECTROPLATING ON PHYSICAL VAPOR DEPOSITION TANTALUM

(71) Applicant: Raytheon Company, Waltham, MA (US)

(72) Inventors: Michael J. Rondon, Santa Rosa, CA (US); Jon Sigurdson, Santa Barbara, CA (US); Eric R. Miller, Orcutt, CA (US)

(73) Assignee: RAYTHEON COMPANY, Waltham, MA (US)

( * ) Notice: Subject to any disclaimer, the term of this patent is extended or adjusted under 35 U.S.C. 154(b) by 78 days.

(21) Appl. No.: 17/098,560

(22) Filed: Nov. 16, 2020

(65) Prior Publication Data

US 2022/0154359 A1    May 19, 2022

(51) Int. Cl.
  C25D 7/12    (2006.01)
  C23C 14/18   (2006.01)
  C25D 3/54    (2006.01)

(52) U.S. Cl.
  CPC ............... C25D 7/12 (2013.01); C23C 14/18 (2013.01); C25D 3/54 (2013.01)

(58) Field of Classification Search
  CPC ............ C25D 7/12–123; C25D 17/001; H01L 21/2885; H01L 21/76873; C23C 28/34; C23C 14/025; C23C 14/0641
  See application file for complete search history.

(56) References Cited

U.S. PATENT DOCUMENTS

| | | | |
|---|---|---|---|
| 2,409,983 A | 10/1946 | Martz | |
| 2,492,204 A | 12/1949 | Van Gilder | |
| 6,140,234 A * | 10/2000 | Uzoh | H01L 21/76873 438/677 |
| 2002/0111010 A1* | 8/2002 | Walker | H01L 24/03 257/E23.021 |
| 2005/0263390 A1* | 12/2005 | Gung | H01J 37/321 204/192.15 |
| 2008/0274369 A1* | 11/2008 | Lee | H01L 21/76873 428/665 |
| 2010/0187693 A1* | 7/2010 | Mountsier | C23C 14/06 257/E21.295 |
| 2013/0334052 A1* | 12/2013 | Chua | C25D 17/10 204/252 |
| 2014/0367267 A1* | 12/2014 | Egan | G01R 31/2653 205/84 |
| 2016/0111344 A1* | 4/2016 | Opocensky | H01L 21/76871 438/608 |
| 2016/0333495 A1* | 11/2016 | Kagajwala | C25D 17/001 |
| 2017/0011987 A1* | 1/2017 | Lee | H01L 23/53238 |
| 2018/0033745 A1* | 2/2018 | Cheng | H01L 21/76807 |
| 2019/0088608 A1* | 3/2019 | Dadvand | H01L 23/49524 |

FOREIGN PATENT DOCUMENTS

EP    3199666    8/2017

* cited by examiner

*Primary Examiner* — Hosung Chung
(74) *Attorney, Agent, or Firm* — CANTOR COLBURN LLP

(57) ABSTRACT

A method for fabricating a wafer stack. The method includes forming a tantalum-nitride film on a substrate of the wafer stack using physical vapor deposition, forming a tantalum layer on the tantalum-nitride film using physical vapor deposition, and depositing indium on the tantalum layer using electroplating.

11 Claims, 6 Drawing Sheets

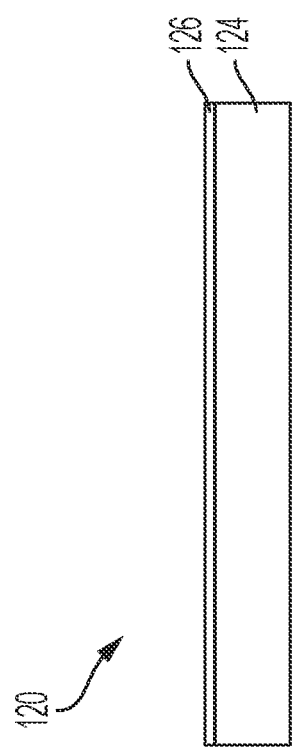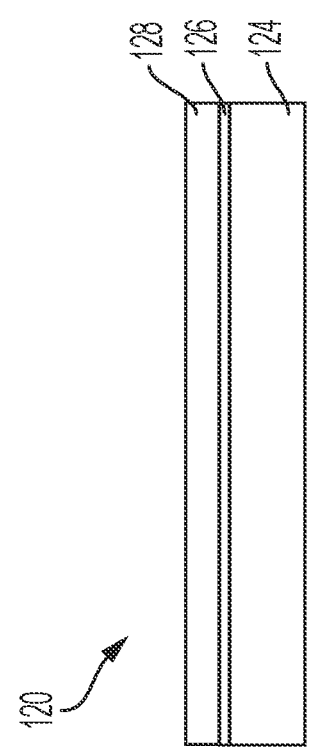

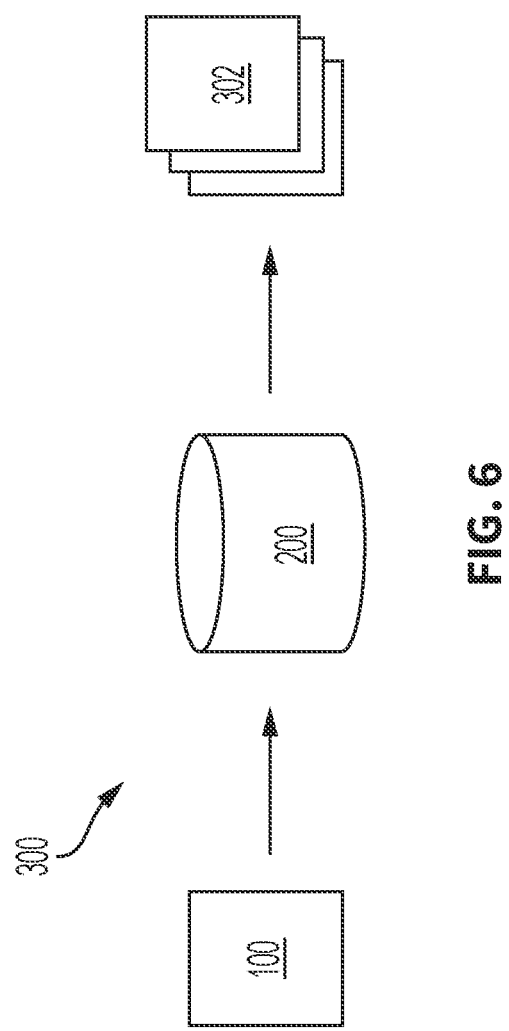

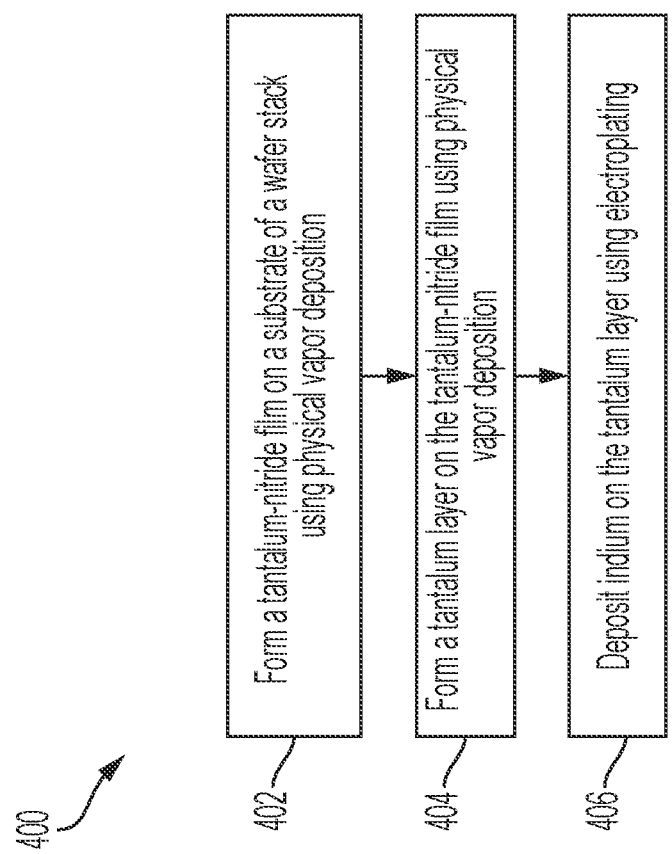

INDIUM ELECTROPLATING ON PHYSICAL VAPOR DEPOSITION TANTALUM

FIELD OF THE DISCLOSURE

The present disclosure generally relates to metal plating and deposition, and more specifically, to indium electroplating on physical vapor deposition tantalum.

BACKGROUND

In semiconductor devices and other such applications, various manufacturing processes are used to form layers of materials having desired properties. In some instances, the materials may react to form alloys during the material deposition process or during later processes that add a greater amount of heat. Alloy formation may result in changes to the electrical characteristics of the resulting assembly and/or may impact the structural integrity of the resulting assembly. Where changes in electrical characteristics occur, signal amplitude and/or timing variations may result in the final assembly when electrical power is applied. The signal amplitude and/or timing variations may result in degraded performance as compared to the expected performance of the final assembly. Structural integrity degradation may shorten the useful life of the final assembly.

SUMMARY

According to a non-limiting embodiment, a method is provided to fabricate a wafer stack. The method includes forming a tantalum-nitride film on a substrate of the wafer stack using physical vapor deposition, forming a tantalum layer on the tantalum-nitride film using physical vapor deposition, and depositing indium on the tantalum layer using electroplating.

According to another non-limiting embodiment, a system for fabricating a wafer stack includes a physical vapor deposition apparatus and an electroplating apparatus. The physical vapor deposition apparatus a deposition chamber and a deposition controller configured to form a tantalum-nitride film on a substrate of the wafer stack using physical vapor deposition in the deposition chamber, and form a tantalum layer on the tantalum-nitride film using physical vapor deposition in the deposition chamber. The electroplating apparatus includes an electroplating bath and an electroplating controller configured to deposit indium on the tantalum layer in the electroplating bath.

According to another non-limiting embodiment, a wafer stack includes a substrate, a tantalum-nitride film formed on the substrate, a tantalum layer formed on the tantalum-nitride film, and indium deposited on the tantalum layer.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the disclosure are apparent from the following detailed description taken in conjunction with the accompanying drawings in which:

FIG. 2 depicts a wafer stack following deposition of a tantalum-nitride film on a substrate according to a non-limiting embodiment;

FIG. 3 depicts a wafer stack following deposition of a tantalum layer on a tantalum-nitride film according to a non-limiting embodiment;

FIG. 6 depicts a system for fabrication of a semiconductor device according to a non-limiting embodiment; and FIG. 7 is a flow diagram illustrating a method of fabricating a wafer stack including a tantalum layer and indium on a substrate according to a non-limiting embodiment.

Figure 1:
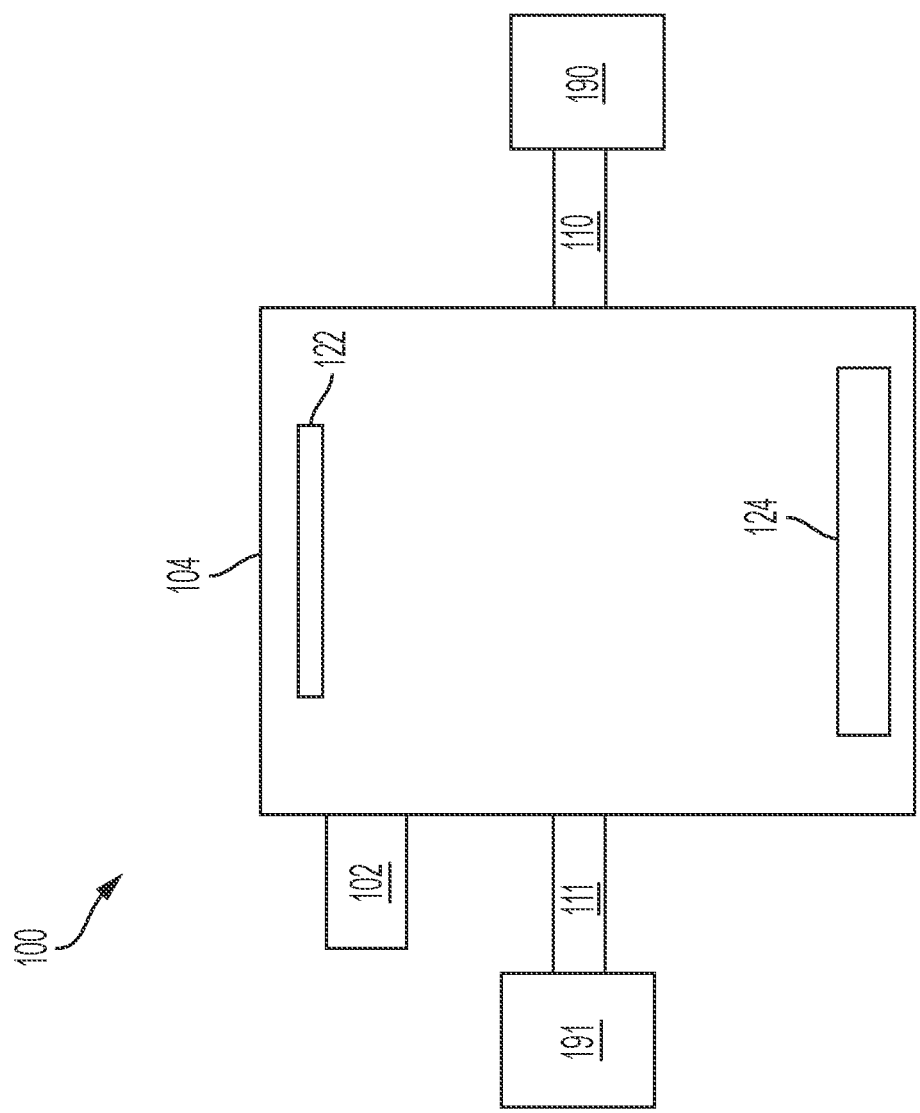
FIG. 1 depicts a physical vapor deposition apparatus according to a non-limiting embodiment.

The diagrams depicted herein are illustrative. There can be many variations to the diagrams or the operations described therein without departing from the spirit of the disclosure. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

Various embodiments of the present disclosure are described herein with reference to the related drawings. Alternative embodiments can be devised without departing from the scope of this disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present disclosure will now be provided. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor device or IC utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation.

The aforementioned doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the disclosure, a combination of apparatuses can be used in a fabrication process to form a wafer stack with indium bumps configured to provide a plurality of conductive paths through the wafer stack. Various seed metals can be used to deposit indium onto a substrate of a wafer. For example, in some applications, indium may be deposited onto tin and nickel seed metal on a substrate. In the case of indium deposited onto tin, an alloy may form when the indium and tin are heated, for instance, above 120 degrees Celsius. Such heating may occur during subsequent fabrication steps performed on the wafer and/or may occur during thermal cycling when the fabrication process is complete, and a resulting device is incorporated into a product. The alloy formation may result in voids as metals diffuse into each other.

Turning now to an overview of the aspects of the disclosure, one or more non-limiting embodiments of the disclosure address the above-described shortcomings of the prior art by electroplating indium onto physical vapor deposition tantalum seed metal to form a wafer stack on a substrate. By using tantalum rather than tin or other such seed metal materials, alloy formation with indium can be avoided when heating occurs. For example, a tantalum and indium junction can be heated to over 150 degrees Celsius without forming an alloy, in contrast to the example of tin and indium. Embodiments of the disclosure can be implemented for indium bump formation, damascene via fill for low temperature devices, or any indium plating process.

With reference now to FIG. 1, a physical vapor deposition apparatus 100 is depicted with a deposition controller 102 and a deposition chamber 104. A chamber inlet 111 couples a gas source 191 to the deposition chamber 104. Although depicted as a single source, the gas source 191 may include multiple gasses that are mixed or controlled through a manifold and valve subsystem. A chamber outlet 110 can couple the deposition chamber 104 to a vacuum pump 190. The deposition controller 102 is configured to control an environment of the deposition chamber 104 during physical vapor deposition. For example, the deposition controller 102 can control the release of one or more gasses from the gas source 191 and control the vacuum pump 190 to establish a flow between the chamber inlet 111 and the chamber outlet 110. The deposition controller 102 can include a processing system and memory (not depicted) programmable to operate the physical vapor deposition apparatus 100 according to desired parameters.

A substrate 124 to form a wafer stack 120 can be placed within the deposition chamber 104 along with tantalum deposition source material 122. The substrate 124 can include one or more layers with at least one insulating layer. For example, a surface exposed for physical vapor deposition can be formed from an insulator material and may include other layers, such as capacitive layers, conductive layers, and semi-conductor layers. Physical vapor deposition of the tantalum deposition source material 122 onto the substrate 124 can be performed as a multi-step process. The deposition controller 102 can be configured to form a tantalum-nitride film 126 on the substrate 124 of the wafer stack 120 using physical vapor deposition in the deposition chamber 104, as illustrated in FIG. 2. The deposition controller 102 can control the gas source 191, vacuum pump 190, and/or other aspects of the physical vapor deposition apparatus 100, such as establishing an electrical charge differential between the tantalum deposition source material 122 and the substrate 124. The deposition controller 102 can be configured to control mixing of argon and nitrogen in the deposition chamber 104 to form the tantalum-nitride film 126 on the substrate 124.

The deposition controller 102 can also be configured to form a tantalum layer 128 on the tantalum-nitride film 126 using physical vapor deposition in the deposition chamber 104, as depicted in the example of FIG. 3. After forming the tantalum-nitride film 126, the deposition chamber 104 can be purged of nitrogen gas, and argon gas can be added/retained such that only argon gas is used during physical vapor deposition of the tantalum deposition source material 122 onto the tantalum-nitride film 126. Tantalum may exist in multiple phases, such as an alpha-phase and beta-phase, where each phase has a different resistivity. In embodiments of the disclosure, the deposition controller 102 controls physical vapor deposition of the tantalum deposition source material 122 to ensure that the tantalum layer 128 is in the alpha-phase by using an environment of argon and depositing the tantalum layer 128 on the tantalum-nitride film 126. Alpha-phase tantalum is characterized as having a lower resistivity than beta-phase tantalum, which can result in a greater electroplating yield. Target thicknesses can be adjusted to match design specifications. In an embodiment of the disclosure, the tantalum-nitride film 126 has a thickness greater than 500 Angstroms. The tantalum layer 128 is generally thicker than the tantalum-nitride film 126. In an embodiment of the disclosure, the tantalum layer 128 is at least three times thicker than the tantalum-nitride film 126. To support electroplating processes, the thicknesses of the tantalum layer 128 and the tantalum-nitride film 126 may be formed such that an average sheet resistance of the tantalum layer 128 and the tantalum-nitride film 126 combined on the substrate 124 is between 0.1 and 1.0 ohms-per-square.

Figure 4:
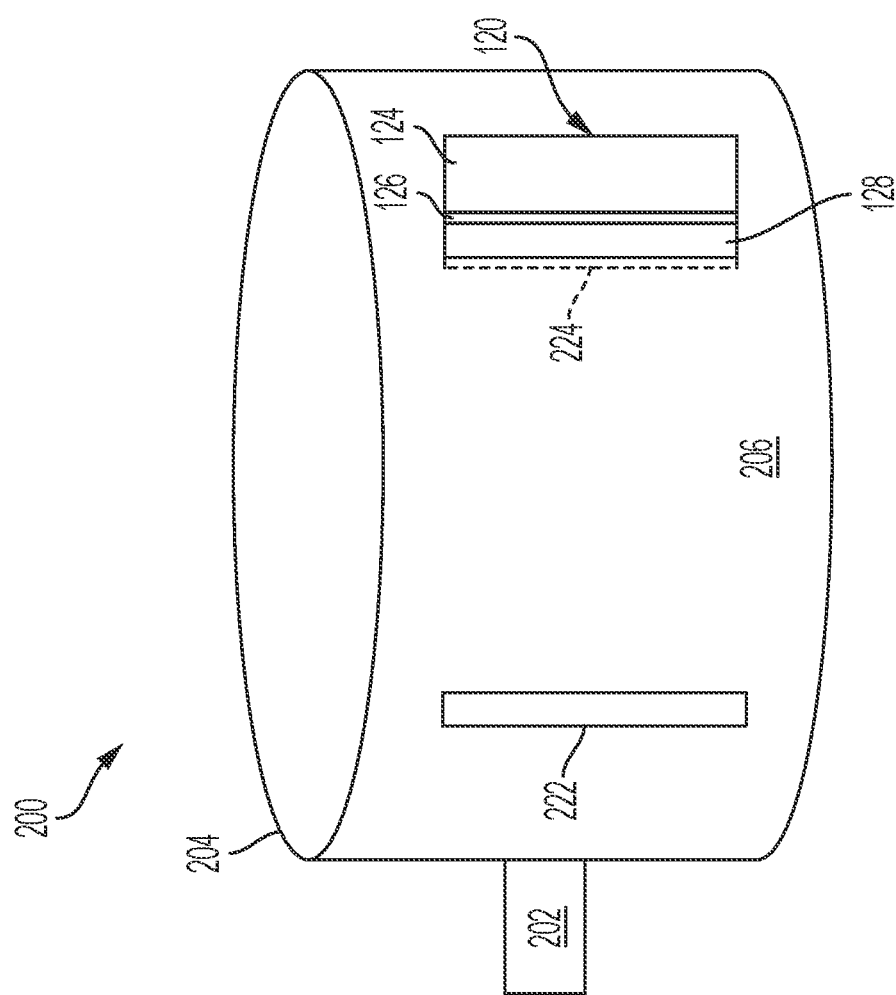
FIG. 4 depicts an electroplating apparatus according to a non-limiting embodiment.
Figure 5:
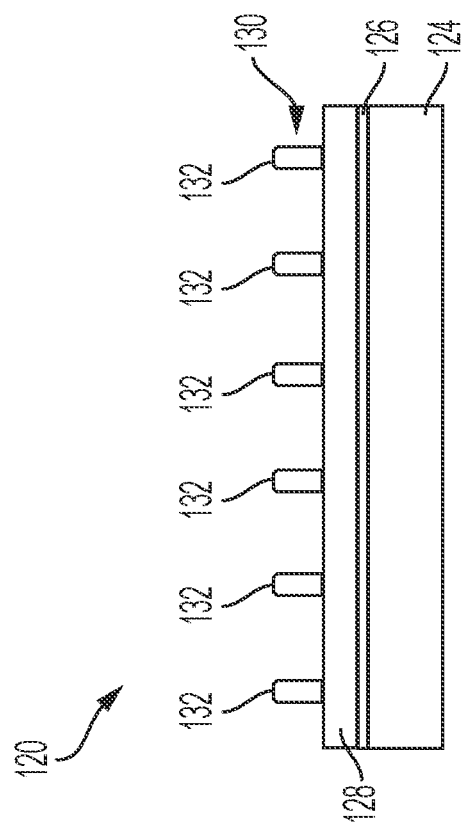
FIG. 5 depicts the wafer stack after completing deposition of indium on a tantalum layer according to a non-limiting embodiment.

FIG. 4 depicts an electroplating apparatus 200 according to a non-limiting embodiment. The electroplating apparatus 200 can include an electroplating controller 202 and an electroplating bath 204. The electroplating controller 202 can control the flow of electricity in indium source material 222 and the wafer stack 120 in a bath liquid 206. The electroplating controller 202 may also control a temperature of the bath liquid 206. The bath liquid 206 can be any liquid suitable for electroplating processes. The wafer stack 120 can be placed into the electroplating bath 204 after the tantalum layer 128 and the tantalum-nitride film 126 are deposited on the substrate 124. A mask 224 may be used to control crystal growth locations of indium on the tantalum layer 128. For example, the mask 224 may have holes or patterns in predetermined locations to allow electroplating deposits in some locations, while preventing electroplating deposits in other locations across the tantalum layer 128. As one example, electrical amplitude, frequency, and dwell times can be controlled by the electroplating controller 202 to deposit indium 130 on the tantalum layer 128 as a plurality of indium bumps 132, as depicted in FIG. 5. The location of the indium bumps 132 can be controlled by placement of the mask 224 or through other processes. The electroplating controller 202 can include a processing system and memory (not depicted) programmable to operate the electroplating apparatus 200 according to desired parameters.

Referring now to FIG. 6, a system 300 for fabrication of a semiconductor device is depicted according to a non-limiting embodiment. The system 300 includes the physical vapor deposition apparatus 100 of FIG. 1, the electroplating apparatus 200 of FIG. 4, and one or more other fabrication apparatuses 302. The system 300 may also include one or more substrate fabrication apparatuses (not depicted) that form the substrate 124 of FIGS. 1-5. The one or more other fabrication apparatuses 302 can form additional layers on the wafer stack 120 of FIGS. 2-5 using various fabrication processes known in the art. One or more of the fabrication processes may raise the temperature of the wafer stack 120 above 120 degrees Celsius, for instance, which can result in alloy formation if materials, such as tin and indium, are directly in physical contact. In some embodiments of the disclosure, one or more other fabrication apparatuses 302 can be configured to heat the indium bumps 132 to a temperature at or above 150 degrees Celsius. By using tantalum, for example, to directly contact indium, alloy formation at such temperatures can be avoided.

Referring now to FIG. 7, a flow diagram illustrates a method 400 of fabricating a wafer stack 120 including a tantalum layer 128 and indium 130 on a substrate 124 according to a non-limiting embodiment. The method 400 can include additional steps beyond those depicted in FIG. 7 and is described with respect to FIGS. 1-7.

The method 400 begins at block 402, where a tantalum-nitride film 126 is formed on the substrate 124 of a wafer stack 120 using physical vapor deposition. Block 402 can be performed using the physical vapor deposition apparatus 100. Forming the tantalum-nitride film 126 on the substrate 124 of the wafer stack 120 using physical vapor deposition can be performed by physical vapor deposition of tantalum from the tantalum deposition source material 122 in an environment of argon and nitrogen.

At block 404, a tantalum layer 128 is formed on the tantalum-nitride film 126 using physical vapor deposition.

Block 404 can be performed using the physical vapor deposition apparatus 100. Forming the tantalum layer 128 on the tantalum-nitride film 126 using physical vapor deposition can be performed by physical vapor deposition of tantalum from the tantalum deposition source material 122 in an environment of argon only.

At block 406, indium 130 is deposited on the tantalum layer using electroplating. Block 406 can be performed using the electroplating apparatus 200. The indium 130 on the tantalum layer 128 can be deposited as a plurality of indium bumps 132 configured to provide a plurality of conductive paths through the wafer stack 120.

As described above, various non-limiting embodiments of the disclosure provide deposition of tantalum and indium on a substrate as part of a wafer stack. Using tantalum rather than another material, such as tin, can prevent alloy formation with respect to indium, thereby avoiding structural gaps between materials that can occur with alloy formation.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

Aspects of the present disclosure are described herein with reference to flowchart illustrations and/or block diagrams of methods, and apparatus (devices) products according to embodiments of the disclosure. The flowchart and block diagrams in the Figures illustrate the architecture, functionality, and operation of possible implementations of the device and method of fabricating the device according to various embodiments of the present disclosure. In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or a unique combination of fabrication operations to fabricate the semiconductor device.

The present disclosure may be a device and/or method of fabricating the device at any possible technical detail level of integration. The descriptions of the various embodiments of the present disclosure have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a wafer stack, the method comprising:

forming a tantalum-nitride film on a substrate of the wafer stack using physical vapor deposition in a deposition chamber of a physical vapor deposition apparatus controlled by a deposition controller;

forming a tantalum layer on the tantalum-nitride film using physical vapor deposition in the deposition chamber controlled by the deposition controller, wherein the tantalum layer is at least three times thicker than the tantalum-nitride film, and an average sheet resistance of the tantalum layer and the tantalum-nitride film combined on the substrate is between 0.1 and 1.0 ohms-per-square; and depositing indium directly on the tantalum layer using electroplating in an electroplating bath of an electroplating apparatus controlled by an electroplating controller.

2. The method of claim 1, wherein forming the tantalum-nitride film on the substrate of the wafer stack using physical vapor deposition is performed by physical vapor deposition of tantalum in an environment of argon and nitrogen.

3. The method of claim 2, wherein forming the tantalum layer on the tantalum-nitride film using physical vapor deposition is performed by physical vapor deposition of tantalum in an environment of argon only.

4. The method of claim 3, wherein the tantalum layer comprises alpha-phase tantalum.

5. The method of claim 1, wherein the indium on the tantalum layer is deposited as a plurality of indium bumps configured to provide a plurality of conductive paths through the wafer stack.

6. A system for fabricating a wafer stack, the system comprising:

a physical vapor deposition apparatus comprising:
        a deposition chamber; and
        a deposition controller configured to form a tantalum-nitride film on a substrate of the wafer stack using physical vapor deposition in the deposition chamber, and form a tantalum layer on the tantalum-nitride film using physical vapor deposition in the deposition chamber, wherein formation of the tantalum layer is controlled to be at least three times thicker than the tantalum-nitride film with an average sheet resistance of the tantalum layer and the tantalum-nitride film combined on the substrate between 0.1 and 1.0 ohms-per-square; and an electroplating apparatus comprising:
        an electroplating bath; and
        an electroplating controller configured to deposit indium directly on the tantalum layer in the electroplating bath.

7. The system of claim 6, wherein the deposition controller is configured to control an environment of the deposition chamber during physical vapor deposition.

8. The system of claim 7, wherein the deposition controller is configured to combine argon and nitrogen in the deposition chamber to form the tantalum-nitride film on the substrate.

9. The system of claim 8, wherein the deposition controller is configured to control the environment of the deposition chamber to include argon only during physical vapor deposition of tantalum to form the tantalum layer as alpha-phase tantalum.

10. The system of claim 6, wherein the electroplating controller is configured to control electroplating of the indium on the tantalum layer as a plurality of indium bumps configured to provide a plurality of conductive paths through the wafer stack.

11. The system of claim 10, further comprising:
a fabrication apparatus configured to heat the indium bumps to a temperature at or above 150 degrees Celsius.

* * * * *